(12) United States Patent
Lancaster-Larocque

(10) Patent No.: US 8,262,069 B2
(45) Date of Patent: *Sep. 11, 2012

(54) USE OF MAGNETS TO PROVIDE RESILIENCE

(75) Inventor: Simon Regis Louis Lancaster-Larocque, Gloucester (CA)

(73) Assignee: Research In Motion Limited, Waterloo (CA)

( * ) Notice: Subject to any disclaimer, the term of this patent is extended or adjusted under 35 U.S.C. 154(b) by 329 days.

This patent is subject to a terminal disclaimer.

(21) Appl. No.: 12/630,825

(22) Filed: Dec. 3, 2009

(65) Prior Publication Data

US 2010/0078864 A1 Apr. 1, 2010

Related U.S. Application Data

(63) Continuation of application No. 11/448,852, filed on Jun. 8, 2006, now Pat. No. 7,648,130.

(51) Int. Cl.
*B25B 11/00* (2006.01)
(52) U.S. Cl. ................................................ 269/8; 269/6
(58) Field of Classification Search .................. 269/8, 6, 269/3, 95, 276, 237, 43
See application file for complete search history.

(56) References Cited

U.S. PATENT DOCUMENTS

| 7,648,130 B2 * | 1/2010 | Lancaster-Larocque | 269/8 |
| 2007/0284795 A1 * | 12/2007 | Lancaster-Larocque | 269/8 |
| 2010/0078864 A1 * | 4/2010 | Lancaster-Larocque | 269/8 |

* cited by examiner

*Primary Examiner* — Lee D Wilson
(74) *Attorney, Agent, or Firm* — Novak Druce + Quigg LLP

(57) ABSTRACT

The clamp-unit is arranged in class-1 double-lever configuration. The levers carry a pair of jaws at one end, and magnets at the other end. The magnets are arranged in repulsive pairs, whereby the magnets urge the jaws together.

20 Claims, 1 Drawing Sheet

USE OF MAGNETS TO PROVIDE RESILIENCE

RELATED APPLICATION

This application is a continuation of U.S. patent application Ser. No. 11/448,852 filed on Jun. 8, 2006 now U.S. Pat. No. 7,648,130.

This disclosure relates to clamping devices, optionally of an operated-by-hand character, in which a person's hand operates against a resilience to open the jaws of the clamp, and the resilience serves to hold the jaws together when the clamp is released. The new design is optionally for use in the field of clamping such items as circuit-boards for finished-production testing.

Exemplary apparatuses will now be described with reference to the accompanying drawings, in which.

Figure 1:
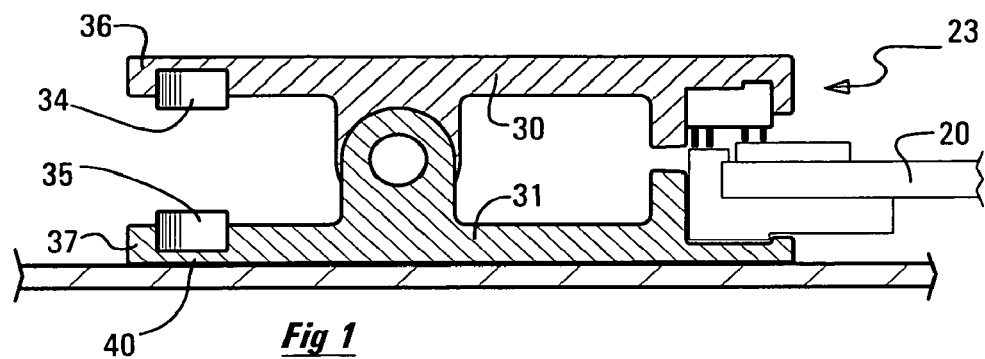
FIG. 1 is a sectioned side elevation of a clamping apparatus, which uses permanent magnets as the source of the clamping force.

The apparatuses shown in the accompanying drawings and described below are examples. The scope of patent protection sought is defined by the accompanying claims, and not necessarily by specific features of the exemplary apparatuses.

The clamping apparatus is used for clamping a circuit board 20 during testing. A clamp-unit 23 includes electrical components 24, which interact with the circuit board 20 being tested. The unit 23 also includes wiring 25 for connecting the electrical components 24 to a base station (not shown) containing the testing instruments etc.

The clamp unit 23 includes an upper-jaw 26 and a lower-jaw 27. The jaws 26,27 are components of respective levers, being an upper-lever 30 and a lower-lever 31.

The levers 30,31 include respective pivot-bosses 32,33, which are linked by a pivot-pin 29.

The clamp-unit 23 includes an upper-magnet 34 and a lower-magnet 35. The magnets 34,35 are carried at the respective magnet-ends 36,37 of the two levers 30,31. The magnets 34,35 are arranged with the respective same-poles of the magnets facing each other, in opposition, whereby the magnets repel each other.

The magnets 34,35 are carried in respective magnet-sockets 38,39 formed in the magnet-ends 36,37 of the levers 30,31. The magnets themselves are in the form of circular discs, and the magnet-sockets 38,39 are complementarily circular, and sized such that the magnets fit snugly but still loosely within the sockets. The sockets locate the magnets, and prevent the magnets from slipping laterally (sideways) with respect to the levers 30,31.

The magnets may be fixed, e.g glued, into the sockets. However, once in place in the sockets, the magnets are prevented from falling out of the sockets by the magnetic forces, whereby further fixing means might not be needed.

The material of the levers 30,31 is non-magnetic. In the example, the material is hard plastic.

The following text-book convention is used to describe the various classes of arrangement of levers and the forces thereon. In a class-1 lever, the pivot lies between the applied-force and the load. In a class-2 and a class-3 lever, the arrangement is that the pivot is at one end of the lever, and both the applied-force and the load lie to the same side of the pivot. In class-2, the load lies between the applied-force and the pivot, and in class-3 the applied-force lies between the load and the pivot.

Figure 2:
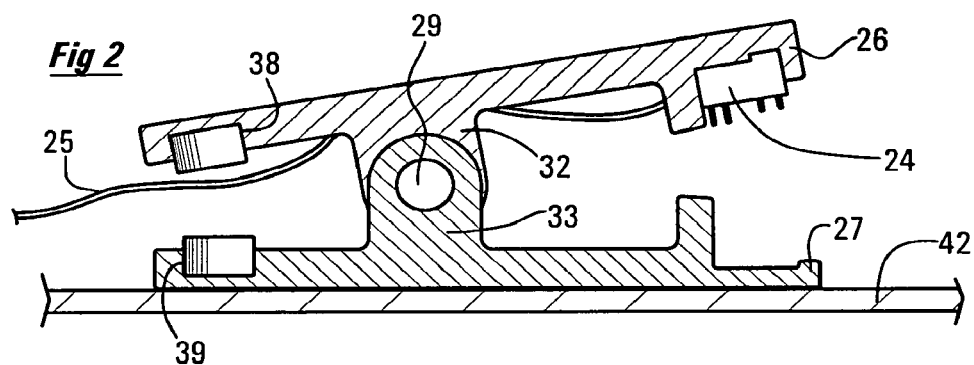
FIG. 2 is the same view as FIG. 1 but shows the clamping apparatus in an opened configuration.

Class-1 double-levers can be arranged in a cross-pivot or scissors configuration; alternatively, class-1 double-levers can be arranged in a rocker-pivot or clothes-pin configuration. The lever arrangement as shown in FIGS. 1,2 is a class-1 double-lever clothes-pin arrangement.

The clamp unit 23, as shown, was intended to be operated manually by a person, especially by an inspector performing the task of inspecting circuit-boards. The forces exerted by the magnets, and the geometry of the clamp unit (including the lever ratio) are such that the inspector can press the magnet-ends 36,37 of the levers 30,31 together, by the use of one hand, and can thereby open the jaws 26,27. The other hand then is available to remove the just-tested circuit-board and insert a fresh one between the jaws. With a fresh circuit-board in place, the inspector releases the clamp, and the jaws close onto the circuit board with the pre-determined force as exerted by the magnets. (Alternatively, of course, the designer might choose to automate the task of opening and closing the jaws.)

The lower magnet-socket 39 is so formed as to leave a thin wall 40 of thickness T, covering the lower pole of the disc of the lower-magnet 35.

The clamp unit 23 is placed on a tabletop 42, which, in the example shown, is a sheet of steel. It is often the case that the inspector wishes to be able to slide the clamp-unit 23 (with or without the under-test circuit-board 20 clamped between the jaws 26,27 thereof) around, on the tabletop 42, and yet the clamp-unit remains firmly held to the tabletop. That is to say, it is desired that the clamp unit can be moved around the tabletop upon the inspector touching or grasping the unit and exerting hand forces on the unit, in order to move the unit; and it is desired that, in the absence of such touching or grasping, the magnetic attraction is sufficient to hold the clamp unit stationary and firmly with respect to the tabletop.

This condition is achieved in the apparatus as shown. The magnet resists separation of the clamp unit from the steel tabletop. The magnet itself, however, is kept from touching directly against the tabletop by reason of the separation due to the thickness T of the plastic material 40.

The designer might make the thickness T greater, whereby the magnetic force holding the clamp unit to the table is reduced—or might make the thickness T smaller, which increases the magnetic force. In order to permit the device to remain stationary and stable on the tabletop when the inspector is not moving the device around, the designer should arrange for the thickness T of the thin wall 40 to be small enough that the lower pole of the lower-magnet 35 is close enough to the steel to exert a substantial magnetic attraction. The clamp-unit 23 is then held firmly against the tabletop 42 by this magnetic attraction.

On the other hand, it is desired that the inspector be able to move the clamp-unit around on the tabletop. The resistance to such lateral movement is the friction that acts parallel to the tabletop, which is proportional to the magnitude of the magnetic attraction, and the designer should arrange for the thickness T to be thick enough that this friction can be easily overcome by the forces exerted by the inspector's hand. Thus, if a lateral frictional resistive force is required of say ten Newtons, the coefficient of friction of plastic against (dry) steel being approximately 0.15, an attractive magnetic force of about sixty Newtons would be required, and the thickness T should be set accordingly.

Figure 3:
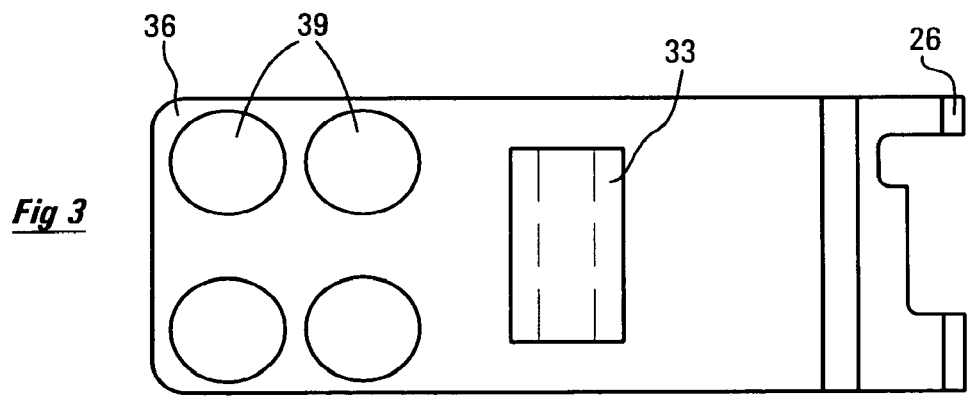
FIG. 3 is a plan view of a modified version of one of the levers of the clamping apparatus of FIG. 1.

The clamp-unit 23 requires a minimum of one pair of magnets. Preferably, the two magnets that make up the pair are arranged to repel each other. As shown in FIGS. 1,2 the designer will usually find it convenient to provide two pairs of magnets. As shown in FIG. 3, four pairs may be provided. If the magnets are not glued in, it is possible for the magnets to be slipped into and out of their sockets by hand, whereby, at least in the FIG. 3 apparatus, the inspector can easily increase or decrease the overall magnetic forces. The designer can also adjust the clamping force by setting the lever ratio of the clamping unit appropriately.

The magnets should be of such material and of such size as will provide the desired level of force. In the illustrated apparatus, the (disc) magnets were twelve mm diameter and five mm thick. The magnets were rare-earth magnets, specifically of nickel-plated neodymium-iron-boron. Each opposed pair of magnets exerted a repel force, over a relative travel vector of six mm, of fifty Newtons. The jaws and the magnets were roughly equidistant from the pivot axis. The thickness T of the thin wall was 1.5 mm.

As shown, the magnets are permanent magnets, and this is preferred for simplicity, convenience and long-term reliability. However, electro-magnets are not ruled out. Electro-magnets might be useful, for example, in that they permit simple automation. In some cases, the magnets (permanent, or electro-) may be supplemented by coilsprings, or other types of resilient springs.

In an apparatus that uses magnets in repulsion, the magnets have a tendency to sideslip. Compared with compression coilsprings, designers usually have more options when it comes to arranging for the two ends of a coilspring to remain in alignment throughout the stroke of the coilspring, than to arrange for two magnets, in repulsion, to remain in alignment throughout their stroke. The magnets have no inherent resistance at all to sideslip, whereas a coilspring does have its own structure.

In the illustrated device, the structure of the device as a whole lends itself to keeping the magnets in proper alignment. Mounting the magnets in robust levers, with robust pivots, that are safe against any mode of movement other than the defined pivoting movement, counters any tendency the magnets might have to sideslip, relative to each other and to the levers. The levers are of robust rigid construction, as is the pivot structure, and together these ensure that the levers remain aligned with each other, and constrained against all modes of movements and deflections other than the defined pivoting movement.

Held thus, the magnets are safe against tipping, rocking, sideslipping, and all the other possible modes of movement. The magnets can move only in the one mode of movement, i.e towards and away from each other along the path as defined and controlled and guided, by the pivot structure. The magnets cannot move relatively in any other mode.

It is noted that the force desired to be exerted on the circuit-board, to secure the circuit-board firmly between the jaws, often is of more or less the same order as the force that can be readily obtained from two pairs of simple disc magnets, of such size as described, arranged in repulsive pairs. Thus, the desired magnitude of forces at the jaws is most easily provided when the lever ratio between the applied force (from the magnets) and the load (between the jaws) is roughly one-to-one. Although a one-to-one ratio is not impossible in the class-2 and class-3 arrangements, practically the class-1 arrangement, as described, is most convenient.

It is generally not desirable to locate strong magnets close to a circuit-board. It is all too easy for electronic components to be affected, if not actually damaged, by being in close proximity to strong magnetic fields. Again, the class-1 lever arrangement ensures that the (strong) magnets are safely spaced away from the possibly-sensitive components—being the components 24 as well as the components of the circuit-board 20.

The wiring 25 by which the unit 23 is connected electrically to the base station usually is required, as shown, to be arranged in flexible pig-tail fashion. It would be all too easy, when the biassing force of the clamp is provided by a coil-spring, for the wires to become snagged or tangled up in the coils, with the resulting possibility of damage to the wiring when the clamp is operated. Nothing like that happens when the force is provided by magnets in repulsion.

It is recognised that disc magnets, in the size and shape as described, are simple to use and effective in performance. It is preferred to use a plurality of opposed pairs, to achieve a given force magnitude, rather than just one pair of large magnets. With a magnet in the form of a large disc, it can be difficult to ensure that the effective centre of the magnetic pole is in the geometric centre of the disc, and, with a large disc, it does not take much, by way of mis-match or offset of the opposing or facing same-poles, for the magnitude of the repel force to be compromised. In an extreme, two opposed large-diameter disc magnets might enter a state in which they might even repel each other over one sector but attract each other over another sector, which would be detrimental in the present case. With smaller-diameter magnets, the manner in which the magnet forces are exerted is much less likely to enter such spurious areas.

From this standpoint, a magnet that has a diameter-to-length ratio of more than about 1:1 might start to exhibit some instability, in the above regard. Above 2:1, the likelihood of instability and/or effective loss of force is so great that magnets with such ratios preferably should not be employed.

The use of magnets for biassing components apart, or together, is well known. The use of magnets in clamping apparatuses, for holding electronic components in position while undergoing testing, is also known. In lines 25-26 of column 4 of U.S. Pat. No. 6,445,200 (Haseyama, 2002), referring to FIG. 7D, which relates to such testing, appear the words: "the pressing unit may include a magnetic spring comprising a pair of magnets arranged so that the same poles of the magnets are opposite to each other."

It may be noted that the function of the clamp-unit as described herein is to provide a clamping force, of the type and under the conditions as described. The action of a clamp may be contrasted with, for example, the action of a cushion. In the Haseyama reference, even though the device is referred to as a "magnetic spring", the spring is not used to bias a pair of jaws together, where the resilience of the biassing spring has to be overcome to force the jaws apart. Rather, in Haseyama, the magnetic spring is used as a force-limiting cushion.

As mentioned, the preferred lever configuration is the class-1 double-lever clothes-pin configuration, in which the magnets are set to repel each other. It might be considered that the class-1 double-lever cross-pivot or scissors arrangement would be equivalent, if the magnets now were set to attract each other. However, that arrangement is not preferred, in that it is considerably more difficult to open a pair of jaws, against a resilient force, by pulling levers apart, than to open the jaws by pushing levers together. In the clothes-pin configuration, the clamp force at the jaws is set by the spring, and is predictable. At the same time, the inspector's hand force is readily available, and easily applied, to open the jaws.

The invention claimed is:

1. A tabletop operable clamping device, comprising:
   an upper lever-A carrieshaving a jaw-A at a first end of upper lever-A, a magnet-A at a second end of upper lever-A, and a pivot point between the first and second ends of upper lever-A;
   a lower lever-B having a jaw-B at a first end of lower lever-B, a magnet-B at a second end of lower lever-B, and a pivot point between the first and second ends of lower lever-B; and
   a lever-pivot at the respective pivot points of upper lever-A and lower-lever B about which jaw-A and jaw-B can undergo relative pivoting movement;
   wherein magnet-A and magnet-B are so mounted on the respective upper and lower levers that like-poles of the magnets lie facing each other to exert a repulsive magnetic force and enable pivoting movement of the respective jaw-ends of upper lever-A and lower lever-B, this pivoting movement being effectible while the device lies on a tabletop surface.

2. The tabletop operable clamping device of claim 1, wherein magnet-B is so mounted on lower lever-B such that the device is held firmly to a magnetic metal tabletop surface.

3. The tabletop operable clamping device of claim 1, wherein upper lever-A, lower lever-B, and the lever-pivot, are arranged in class-1, clothes-pin configuration, whereby the relative pivoting movement between jaw-A and jaw-B is effectible in a one-handed manual operation by manually pressing the second end of upper lever-A towards lower lever-B lying on the tabletop surface.

4. The tabletop operable clamping device of claim 1, wherein the jaw-ends of upper lever-A and lower lever-B are adapted to receive an object for clamping, and to allow connection of the object to an electrical lead that freely passes between magnet-A and magnet-B mounted on the respective upper and lower levers.

5. The tabletop operable clamping device of claim 1, wherein the repulsive force between magnet-A and magnet-B is in the order of fifty Newtons.

6. The tabletop operable clamping device of claim 2, wherein the attractive force between magnet-B and the magnetic metal tabletop is in the order of sixty Newtons.

7. The tabletop operable clamping device of claim 2, wherein the attractive force between magnet-B and the magnetic metal tabletop provides a lateral frictional resistive force sufficient to hold the device in use, and also allow the device to be manually moved around the tabletop.

8. The tabletop operable clamping device of claim 2, wherein the second end of upper lever-A is configured to receive a pressing force, thereby to open the jaw ends of upper lever-A and lower lever-B.

9. The tabletop operable clamping device of claim 1, further comprising a plurality of pairs of magnets mounted on the respective upper lever-A and lower lever-B, the plurality of pairs of magnets arranged with their respective same-poles facing each other, in opposition, whereby the plurality of pairs of magnets repel each other.

10. The tabletop operable clamping device of claim 1, wherein magnet-A and magnet-B are one of permanent magnets or electro-magnets.

11. The tabletop operable clamping device of claim 1, wherein magnet-A and magnet-B are electro-magnets, and are configured to be operable to automate opening and closing the respective jaw-ends of upper lever-A and lower lever-B.

12. The tabletop operable clamping device of claim 1, wherein magnet-A and magnet-B are sized and shaped to fit snugly within sockets provided at the respective second ends of upper lever-A and lower lever-B.

13. The tabletop operable clamping device of claim 12, wherein magnet-A and magnet-B are fixed within the sockets.

14. The tabletop operable clamping device of claim 12, wherein upper lever-A and lower-lever-B comprise a non-magnetic material comprising hard plastic.

15. A tabletop operable clamping device, comprising:
   an upper lever and a lower lever arranged in a double-lever configuration to pivot at a lever-point, wherein:
   respective first ends of the upper lever and lower lever have jaws configured to receive a component therein;
   respective second ends of the upper lever and lower lever have at least one pair of magnets arranged with their respective same-poles facing each other, in opposition, such that the at least one pair of magnets repel each other; and
   pivoting movement of the upper lever and lower lever at the lever-point is effectible by relative movement between the at least one pair of magnets while the device lies on a tabletop surface.

16. The tabletop operable clamping device of claim 15, wherein the upper lever and lower lever include pivot-bosses located between the respective first ends and second ends, the pivot-bosses linked at the lever-point by a pivot-pin.

17. The tabletop operable clamping device of claim 16, wherein the lever-point provides a pivoting movement which allows a controlled and guided pivoting movement of magnet-A and magnet-B towards and away from each other, and constrains magnet-A and magnet-B against tipping, rocking or side slipping movements relative to each other.

18. A tabletop operable clamping device, comprising:
   an upper lever and a lower lever arranged in a double-lever configuration to pivot at a lever-point, wherein:
   respective first ends of the upper lever and lower lever have jaws configured to receive a component therein;
   respective second ends of the upper lever and lower lever have at least one pair of magnets arranged with their respective same-poles facing each other, in opposition, such that the at least one pair of magnets repel each other; and
   the lever-point is located between the respective first ends and second ends of the upper lever and lower lever and pivoting movement is effectible by relative movement between the at least one pair of magnets while the device lies on a tabletop surface.

19. The tabletop operable clamping device of claim 18, wherein the at least one pair of magnets is sufficiently spaced away from the respective jaw-ends of the upper lever and lower lever, such that any electronic component held within the jaw-ends of the upper lever and lower lever are not affected by the at least one pair of magnets.

20. The tabletop operable clamping device of claim 19, wherein the arrangement of the respective second ends of the upper lever and lower-lever prevents any wires connected to any electronic component held within the jaw-ends from becoming snagged or tangled.

* * * * *